(12) United States Patent
Wu

(10) Patent No.: US 6,936,905 B2
(45) Date of Patent: Aug. 30, 2005

(54) TWO MASK SHOTTKY DIODE WITH LOCOS STRUCTURE

(75) Inventor: Shye-Lin Wu, No. 10, Alley 53, Lane 454, Chen Kung Road, Hu Kuo Hsiang, Hsinchu Hsien (TW)

(73) Assignees: Shye-Lin Wu, Hsinchu Hsien (TW); Chip Integration Tech Co., Ltd., Hsin-Chu (TW)

( * ) Notice: Subject to any disclaimer, the term of this patent is extended or adjusted under 35 U.S.C. 154(b) by 29 days.

(21) Appl. No.: 10/421,781

(22) Filed: Apr. 24, 2003

(65) Prior Publication Data

US 2004/0211974 A1 Oct. 28, 2004

(51) Int. Cl.[7] .................. H01L 27/095; H01L 29/47; H01L 29/812; H01L 31/07; H01L 31/108
(52) U.S. Cl. .................. 257/484; 257/471; 257/475; 257/483
(58) Field of Search .................. 257/471, 475, 257/476, 480, 481, 483, 484–486

(56) References Cited

U.S. PATENT DOCUMENTS

| | | | | |
|---|---|---|---|---|
| 5,859,465 | A | * 1/1999 | Spring et al. | 257/484 |
| 6,583,485 | B2 | * 6/2003 | Epke | 257/484 |
| 6,657,273 | B2 | * 12/2003 | Skocki | 257/471 |
| 2003/0218230 | A1 | * 11/2003 | Takahashi et al. | 257/471 |

FOREIGN PATENT DOCUMENTS

| | | | | |
|---|---|---|---|---|
| JP | 56002672 A | * 1/1981 | ........... | H01L/29/91 |
| JP | 60154683 A | * 8/1985 | ........... | H01L/29/91 |
| JP | 03185870 A | * 8/1991 | ........... | H01L/29/48 |
| JP | 04162682 A | * 6/1992 | ........... | H01L/29/91 |

OTHER PUBLICATIONS

N.G. Wright et al., Surface Passivation Techniques for GaAs Power Schottky Diodes, 1997, IEEE, International Symposium on Power Semiconductor Devices and ICs, pp. 141–144.*

* cited by examiner

*Primary Examiner*—George Eckert
(74) *Attorney, Agent, or Firm*—Troxell Law Office, PLLC

(57) ABSTRACT

A power Schottky rectifier device and method of making the same are disclosed. The Schottky rectifier device including a LOCOS structure and two p-type doping regions, which are positioned one above another therein to isolate cells so as to avoid premature of breakdown voltage. The Schottky rectifier device comprises: an n– drift layer formed on an n+ substrate; a cathode metal layer formed on a surface of the n+ substrate opposite the n– drift layer; a pair of field oxide regions and termination region formed into the n– drift layer and each spaced from each other by the mesas, where the mesas have metal silicide layer formed thereon. A top metal layer formed on the field oxide regions and termination region and contact with the silicide layer. Under each of field oxide regions and termination region is a p doped and p– doped region cascade which provide depleted regions enclosed the p– doped regions to blocking the leakage current while a reverse bias voltage is exerted to the Schottky power rectifier diode.

7 Claims, 5 Drawing Sheets

TWO MASK SHOTTKY DIODE WITH LOCOS STRUCTURE

FIELD OF THE INVENTION

The present invention relates to a semiconductor process, specifically, to a Schottky barrier power rectifier having LOCOS structure to simplify the production process and to reduce leakage current at high reverse bias.

BACKGROUND OF THE INVENTION

Schottky diode is an important power device and used extensively as output rectifiers in switching-mode power supplies and in other high-speed power switching applications, such as motor drives, switching of communication device, industry automation and electronic automation and so on. The power devices are usually required characteristics of carrying large forward current, sustaining high reverse bias, such as 100 volt or above, and minimizing the reverse leakage current.

A number of power rectifiers have been used to provide high current and reverse blocking characteristics. An exemplary method to form a Schottky barrier diode is disclosed by Kanemaru et al in U.S. Pat. No. 6,483,164. the processes are shown in FIG. 1A to FIG. 1C. Referring to FIG. 1A, a semiconductor substrate having an n+ doped layer 10 and an n drift layer 20 extended to a first surface 20A is prepared. An oxide layer 25 is then formed on the first surface 20A. Afterward, referring to FIG. 1B, the oxide layer 25 is patterned to define positions of guard ring 35 at the termination region. Guard ring regions 35 doped with p-type impurities are then buried into n drift layer 20 by boron ion implantation or diffusion using boron nitride film as a source. Thereafter, a thermal oxidation is then performed to drive in the boron impurities into silicon substrate. At the same time, an oxide layer 30 is grown on the first surface and thickened the oxide layer 25. Thereafter, a second photoresist pattern 40 using to define an anode contact region is then coated on the resultant surface.

Referring to FIG. 1C, a wet etch is then performed to remove those exposed oxide layers 30, 25 by using the photoresist pattern 40 as a mask. Portions of p+ guard ring regions 35 and the n drift layer 20 in between are thus exposed. After removing photoresist pattern 40, a Schottky barrier metal layer 50 is then formed on the resultant surface. Thereafter, a third photoresist (not shown) and an etch steps are then performed to defied the Schottky barrier metal layer 50. After the layers formed on the backside surface during forgoing step are removed, a metal layer 60 is then formed, which is served as a cathode.

The conventional Schottky rectifier with guard rings 35 may require at least three photo masks. Thus, an object of the present method is to improve the breakdown voltage and simplify the processes. According to the present invention, only two photo masks are used.

SUMMARY OF THE INVENTION

A power Schottky rectifier device and method of making the same are disclosed. The Schottky rectifier device including LOCOS structure and two p-type doping layers formed thereunder to avoid premature of breakdown voltage. The Schottky rectifier device comprises: an n– drift layer formed on an n+ substrate; a cathode metal layer formed on a surface of the n+ substrate opposite the n–drift layer; a pair of field oxide regions and termination field oxide region formed into the n– drift layer and each spaced from each other by the mesas, where the mesas have metal silicide layer formed thereon. A top metal layer is formed on the field oxide regions and the termination region and the silicide layer. Under each of field oxide regions and termination region is a p doped and p– doped region cascode which result in the depletion regions enclosed the p– doped regions to block the leakage current when a high reverse bias is applied to the Schottky power rectifier diode.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1A:
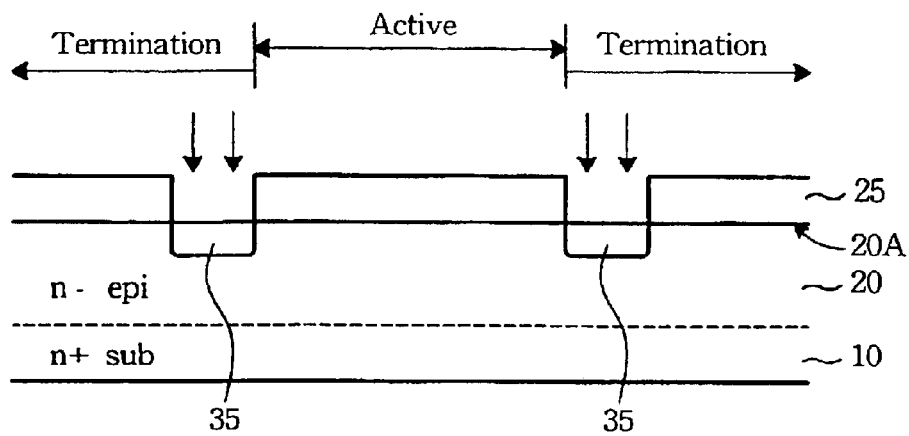
FIGS. 1A to 1C show steps of forming a conventional three-mask Schottky barrier diode with p+ guard ring structure at the termination in accordance with prior art.
Figure 1B:
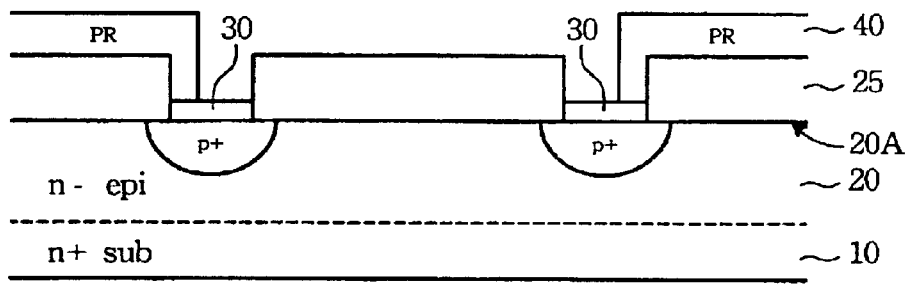
Figure 1C:
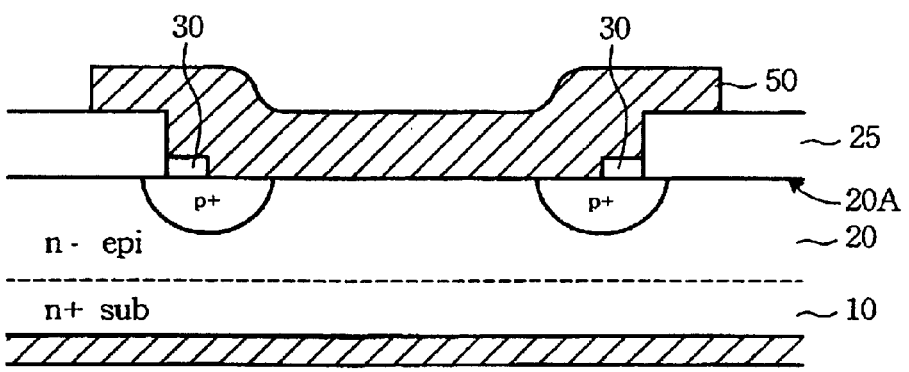
Figure 2:
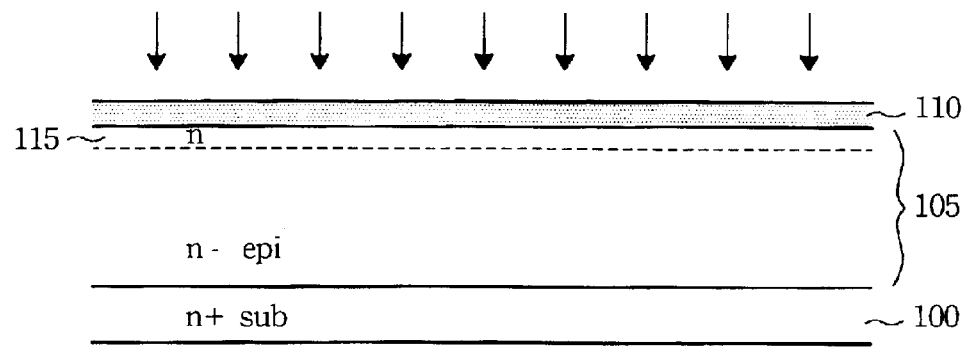
FIG. 2 is a cross-sectional view of forming an oxide layer on an n– epi-layer and an n layer beneath the n– epi-layer of an n+ semiconductor substrate in accordance with the present invention.

As depicted in the forgoing background of the invention, the conventional technique requires at least three photo masks to form a power rectifier device and its termination structure. The present invention can simplify the processes and only two photo masks are used. The detailed descriptions are as follows:

Referring to FIG. 2, a cross-sectional view, shows an n+ doped semiconductor substrate 100 formed with a drift layer thereon which is an n– epi-layer 105. An oxide layer 110 of about 5–50 nm in thickness grown on the n– epi-layer 105 is then followed.

Afterward, a blanket ion implantation by implanting n-type ion species into n– epi layer 105 to form an n layer 115 beneath the oxide layer 110 is then carried out. The dosage and implant energy are, respectively, from 0 (without implant) to $5 \times 10^{13}/cm^2$ and 10–200 keV for phosphorus ion implant. Hence, the impurity concentration in n layer 115 is higher than that of in the n− epi layer 105 but still lower than that of in the n+ doped semiconductor substrate 100.

Figure 3:
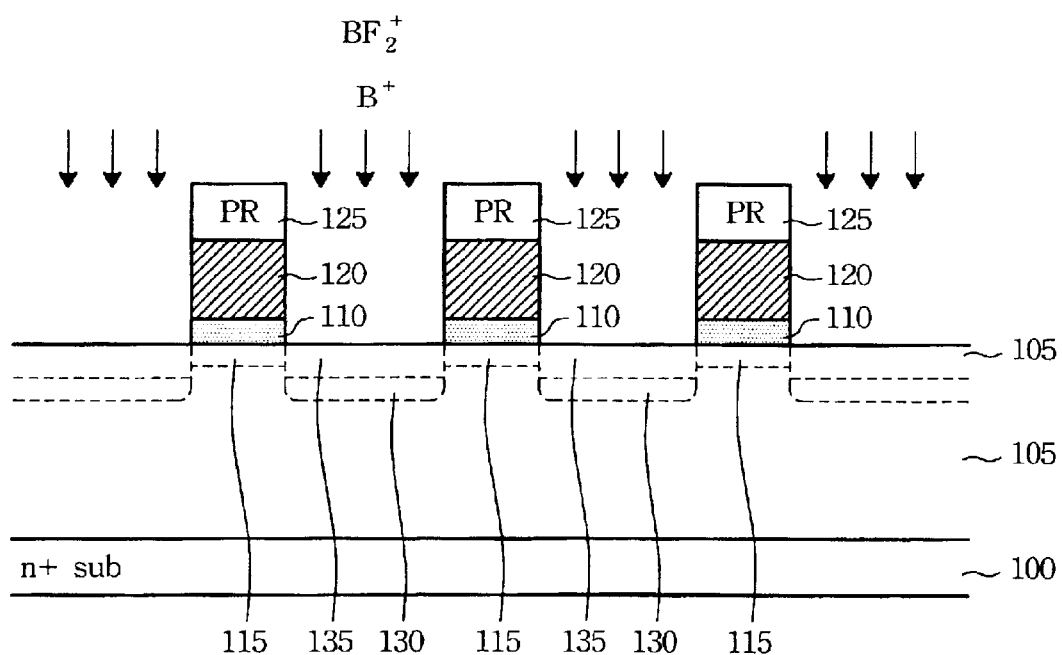
FIG. 3 is a cross-sectional view of forming nitride mask pattern layer on the oxide layer and forming a dual implant region into n–epi layer in accordance with the present invention.

To define active region, referring to FIG. 3, a nitride layer 120 is formed on the oxide layer 110. A photoresist pattern 125 coated on the nitride layer 120 to define active region is then followed. Subsequently, an etching back step is performed to etch the nitride layer 120 and the oxide layer 110 by using the photoresist pattern 125 as a mask.

Still referring to FIG. 3, a dual implant process implants B+ and $BF_2$+ into the n− epi layer 105 to form a p− region 130 and a p region 135 in different depths is then successively performed. The dosage and the implant energy are about $5\times10^{11}$–$5\times10^{14}$/cm$^2$ and 10–200 keV for boron ions and about $5\times10^{12}$–$5\times10^{15}$/cm$^2$ and 30–200 keV for $BF_2$+ ions.

Figure 4:
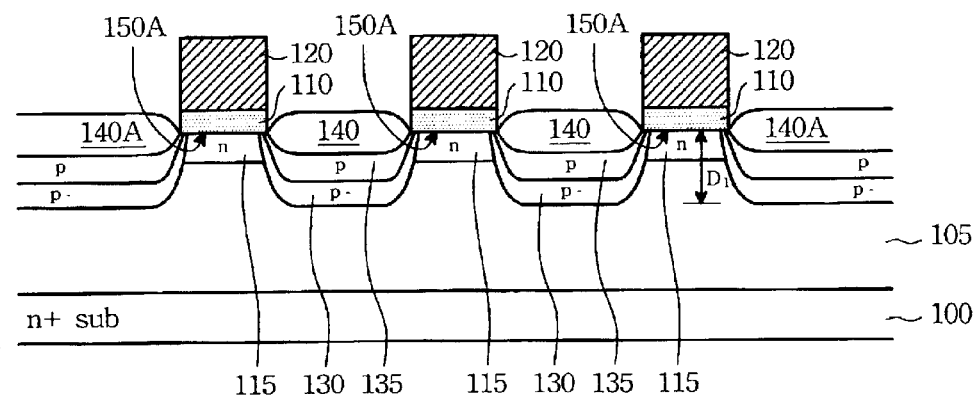
FIG. 4 is a cross-sectional view of performing thermal oxidation to form LOCOS structure, and termination region, as well as to extend the dual p region in accordance with the present invention.

After ion implantation, the photoresist pattern 125 is stripped away and a thermal oxidation process is followed by using the nitride layer 120 as a mask, as is shown in FIG. 4. During the thermal oxidation process, a pair of thick field oxide regions 140 formed into the active region of the substrate and thick oxide termination regions 140A formed into the perimeter of the substrate are grown by using the nitride layer 120 as a mask. In addition, the ions in the p− region 130, p region 135, and n layer 115 are driven in both lateral and longitudinal into—epi layer 105 and results in extending the regions thereof.

In a preferred embodiment, the width of the mesa region 150A in between two field oxide regions 140 and in between the field oxide region 140 and the termination region 140A is between about 1–30 mm for field oxide region having 0.1–2 mm in thickness and the p/n junction 130/105 having a depth D1 of about 0.1–5 mm from the surface of the mesa region 150A.

Figure 5:
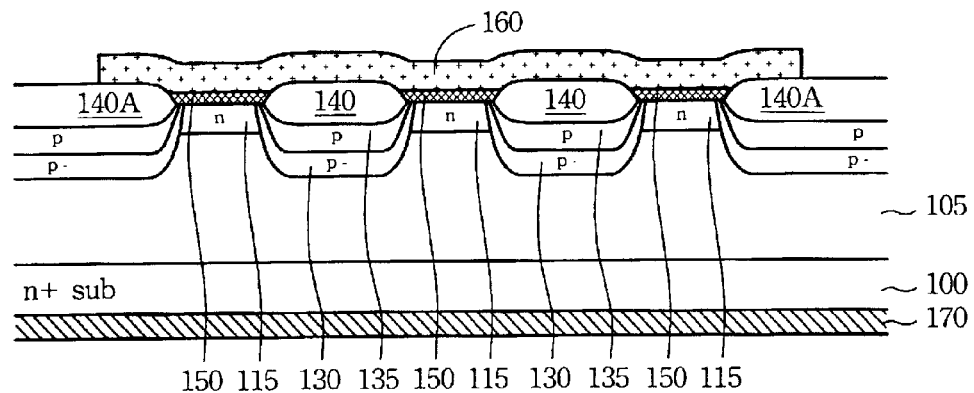
FIG. 5 is a cross-sectional view of forming metal silicide at the mesa region and forming a patterned anode electrode on the front surface and a cathode electrode on the back side surface of the substrate.

Referring to FIG. 5, the nitride layer 120 and the pad oxide layer 110 are removed firstly. A refractory metal Schottky barrier layer 150 deposited on the front surface is then followed. The material of the refractory metal, for instance, Ti, Ni, Cr, Mo, Pt, Zr, W etc., can be acted as candidates. After a silicidation process to form a Schottky barrier silicide layer 50 at mesa region 150A, the unreacted metal layer on both field oxide region 140 and termination region 140A is then removed by a wet etch. Afterward a top metal layer 160 is deposited on the Schottky barrier silicide layer 150 and covered the field oxide regions 140 and the termination region 140A. The material of the top metal layer 160 is chosen, for example, from Ti/Ni/Ag or Ti/Ni/Al wherein the Ti and Ni are co-deposited. Subsequently, the top metal layer 160 served as anode is patterned to defined the extension portions on the termination regions 140A. A backside layer milling by a chemical/mechanical polish process is then followed to remove all of the layers during aforementioned processes formed thereon. Preferably, the milling step also removes a portion thickness of the n+ substrate 100. Thereafter, a metal layer 170 is formed on the milled surface to function as a cathode electrode.

Figure 6A:
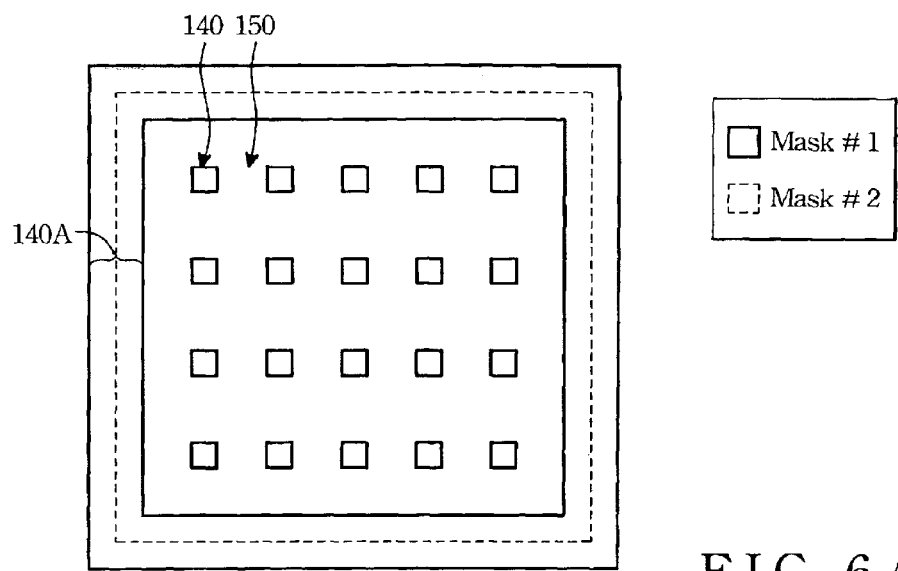
FIGS. 6A and 6B are a synoptic layouts to show the field oxide regions at the active regions and the termination region; only two masks are used.
Figure 6B:
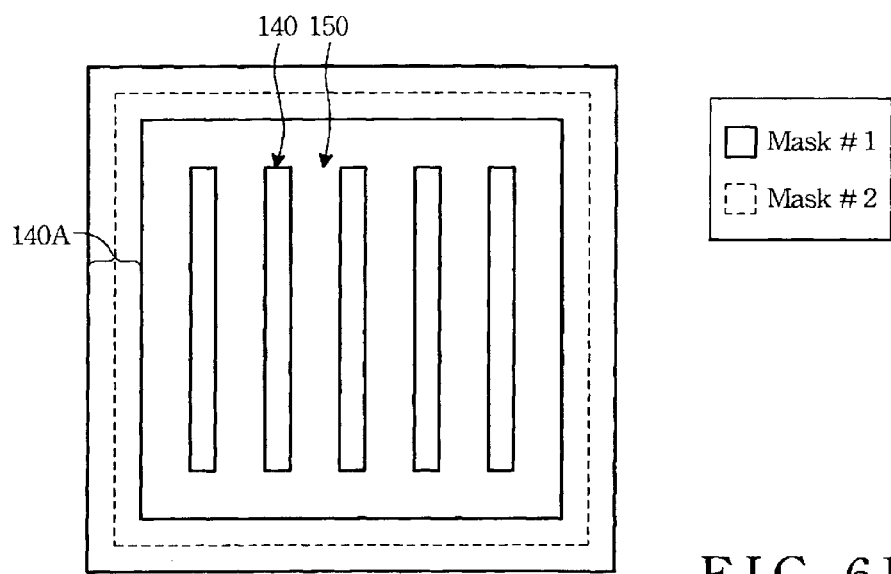

FIG. 6A shows a synoptic layout of the devices in accordance with the present invention. It shows more field oxide regions at the oxide regions than forgoing cross-sectional view. Other than the field oxidation regions distributed in a form of dots in a matrix, they can be distributed in a form of long strips in parallel, as is shown in FIG. 6B. Only two photo masks are required to form high performance Schottky barrier diode—one is to define the active region, the other one is to define the anode metal. The field oxide regions 140 in the active region, however, can serve as a buffer layer for stress relief while bonding on the top surface.

Figure 7:
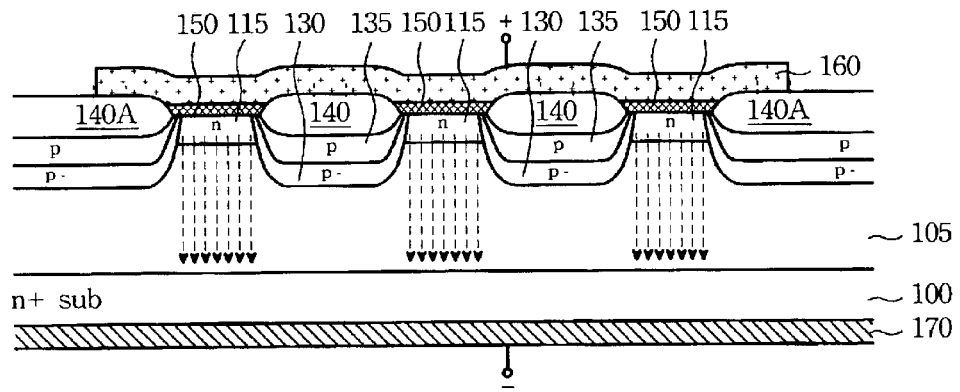
FIG. 7 is a schematic diagram for illustrating the forward current when a forward biased is applied to the Schottky rectifier.
Figure 8:
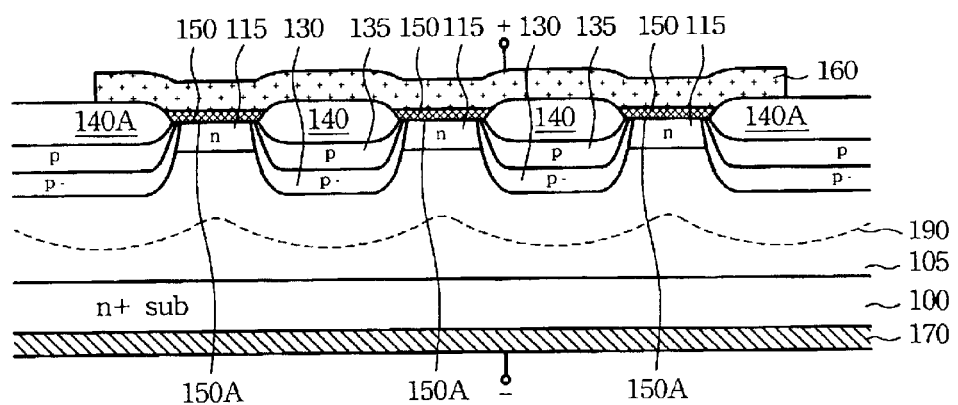
FIG. 8 is a schematic diagram for illustrating the depletion region when a reverse biased is applied to the Schottky rectifier.

The operations of the Schottky rectifier under forward biased and reverse biased are, respectively, illustrated in FIG. 7 and FIG. 8. In FIG. 7, the anode 160 is applied with a positive voltage with respect to the cathode 170. Most of the forward current consisting of majority carrier is through the mesas 150A, the Schottky contact, which is a silicide layer. Only few of current is through the fringes of the field oxide region to p-n junction 135/105 since the turn on voltage of the Schottky contact is less than that of the p-n junction and the lower resistance of the silicide layer versus extremely high resistance of the thick of the field oxide layer.

When the Schottky rectifier is under reverse biased voltage, the depletion region 190 is formed around the p− region 130 and p region 135. The depletion region 190 is expanded with the increase of the reverse bias voltage. The breakdown voltage of the device is also increased with the increase of thickness of the LOCOS. The enclosed depletion region 190 at reverse bias voltage will lower reverse leakage current.

The benefits of this invention are:
(1) The processes provided are much simpler than the conventional methods. The method according to the present invention demands only two photo masks: one is to define the active region and the other is for top metal electrode definition.
(2) The field oxide regions in the active region of the substrate can serve as a buffer layer for stress relief during the bonding process. In addition, the field oxide regions 140 can also improve the breakdown voltage.
(3) The termination field oxide regions 140A are broad and flatted and thus the bending regions of the depletion boundary are anticipated to be far away from the active region than the conventional device.
(4) The forward current is almost composed of majority carriers and thus the switching speed of the device is superior to those of the conventional devices.

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

What is claimed is:

1. A power rectifier device, comprising:
an n− drift layer formed on an n+ substrate;
a cathode metal layer formed on a surface of said n+ substrate opposite said n− drift layer;
a pair of field oxide regions formed into said n− drift layer, said field oxide regions separated by a first mesa;
a pair of termination regions surrounding and spaced from said pair of field oxide regions by a second mesa;
a p type doped region beneath each of said termination regions and said field oxide regions, said p type doped region beneath each of said termination regions being extended to the entire termination regions;
a Schottky barrier silicide layer formed on said first mesa and said second mesa; and
a top metal layer acting as an anode electrode formed on said Schottky barrier silicide layer, said field oxide regions and extended to cover a portion of said termination regions.

2. The power rectifier device according to claim 1 and further comprising an n doped layer formed beneath said Schottky barrier silicide layer wherein said n doping layer has impurity concentration higher than that of said n− drift layer but lower than that of said n+ substrate.

3. The power rectifier device according to claim 1 and further comprising a p− doped region formed adjacent and under said p doped region.

4. The power rectifier device according to claim 1, wherein said field oxide regions are between 0.1 $\mu$m–2 $\mu$m in thickness and a junction of said p type doped region/n− drift layer has a depth of about 0.1–5 $\mu$m from the surface of said n− drift layer, and a spacing between two field oxide regions is between about 1–30 $\mu$m.

5. The power rectifier device according to claim 1 wherein said Schottky barrier silicide layer is formed of metal silicide selected from the group consisting of silicide of Ti, Ni, Cr, Mo, Pt, Zr, and W.

6. The power rectifier device according to claim 1 wherein said top metal layer is formed of stack layers of Ti/Ni/Ag or Ti/Ni/Al.

7. A power rectifier device, comprising:

an n− drift layer formed on an n+ substrate;

a cathode metal layer formed on a surface of said n+ substrate opposite said n− drift layer;

a pair of field oxide regions formed into said n− drift layer, said field oxide regions separated by a first mesa;

a pair of termination regions surrounding and spaced from said pair of field oxide regions by a second mesa;

a p− type doped region beneath each of said termination regions and said field oxide regions;

a Schottky barrier silicide layer formed on paid first mesa and said second mesa;

an n− doped layer formed beneath said Schottky barrier silicide layer wherein said n− doping layer has impurity concentration higher than that of said n− drift layer but lower than that of said n+ substrate; and a top metal layer acting as an anode electrode formed on said Schottky barrier silicide layer, said field oxide regions and extended to cover a portion of said termination regions.

* * * * *